United States Patent
Schade et al.

(10) Patent No.: US 11,996,953 B2
(45) Date of Patent: May 28, 2024

(54) SYSTEM FOR DETECTING AN INPUT AND CONTROLLING AT LEAST ONE DOWNSTREAM DEVICE

(71) Applicant: emz-Hanauer GmbH & Co. KGaA, Nabburg (DE)

(72) Inventors: Lukas Schade, Nabburg (DE); Manfredi Signorino, Wackersdorf (DE); Martin Brabec, Nabburg (DE)

(73) Assignee: EMZ-HANAUER GMBH & CO. KGAA, Nabburg (DE)

( * ) Notice: Subject to any disclaimer, the term of this patent is extended or adjusted under 35 U.S.C. 154(b) by 0 days.

(21) Appl. No.: 17/736,757

(22) Filed: May 4, 2022

(65) Prior Publication Data

US 2022/0368555 A1   Nov. 17, 2022

(30) Foreign Application Priority Data

May 11, 2021 (DE) .......................... 102021112324.0

(51) Int. Cl.
  *H04L 12/28* (2006.01)
  *H03H 17/02* (2006.01)
  *H04W 72/23* (2023.01)
  *H04W 4/38* (2018.01)

(52) U.S. Cl.
  CPC ....... *H04L 12/282* (2013.01); *H03H 17/0213* (2013.01); *H04W 72/23* (2023.01); *H04L 2012/2841* (2013.01); *H04L 2012/285* (2013.01)

(58) Field of Classification Search
  CPC ........... H04L 12/282; H04L 2012/2841; H04L 2012/285; H03H 17/0213; H04W 72/23; H04W 4/38
  USPC ....................................................... 700/275
  See application file for complete search history.

(56) References Cited

U.S. PATENT DOCUMENTS

2020/0225655 A1*  7/2020  Cella ................ G05B 19/41875
2020/0284883 A1*  9/2020  Ferreira .................. G01S 17/10

FOREIGN PATENT DOCUMENTS

DE    102017208447    11/2018
DE    102017210316    12/2018

OTHER PUBLICATIONS

Official Action (no English translation available) for Germany Patent Application No. 102021112324.0, dated Aug. 3, 2022, 8 pages.

* cited by examiner

*Primary Examiner* — Michael J Brown
(74) *Attorney, Agent, or Firm* — Sheridan Ross PC (57) ABSTRACT

The invention relates to a system for detecting an input and controlling at least one downstream device, wherein the system comprises at least one sensor device and an evaluation and control device connected to the sensor device for signalling purposes, wherein the at least one sensor device detects an input signal which varies at least over time in the form of a movement, wherein the evaluation and control device evaluates at least the time profile of the detected input signal, wherein at least one evaluation condition is specified, and wherein the downstream device is activated when the at least one evaluation condition is met.

16 Claims, 3 Drawing Sheets

SYSTEM FOR DETECTING AN INPUT AND CONTROLLING AT LEAST ONE DOWNSTREAM DEVICE

CROSS-REFERENCE TO RELATED APPLICATION

This application claims the benefit of German Patent Application No. 10 2021 112 324.0 filed May 11, 2021, the entire contents of which are incorporated herein by reference in its entirety.

FIELD

The invention relates to a system for detecting an input and controlling at least one downstream device, the system comprising at least one sensor device and an evaluation and control device connected to the sensor device for signalling purposes. Furthermore, the invention relates to a method for detecting an input and controlling at least one downstream device. Furthermore, the invention relates to a household appliance comprising a system for detecting an input and controlling at least one downstream device.

BACKGROUND

A system of this type can be used in a variety of ways if the simplest possible type of input is to allow control of a downstream device. Such a downstream device can be a door opening device, for example. A door can usually be opened manually with a corresponding handle. However, providing such a handle may not be desirable for certain reasons. These can be aesthetic reasons, for example. Due to the fact that the door handles are usually difficult to clean, such a handle can also be disadvantageous for hygiene reasons. This can also apply to buttons, switches and other operating elements.

For example, a system of this type can be used in a household appliance. Such a household appliance could be a dishwasher. A so-called handle-free household appliance has the advantage that it can be installed in a fully integrated manner in a kitchen arrangement.

SUMMARY

The object of the present invention is therefore to provide a system for detecting an input and controlling at least one downstream device and a method for detecting an input and controlling at least one downstream device, which overcomes the disadvantages mentioned at the outset.

This object is achieved by the subject matter of claims 1, 9 and 11. The dependent claims comprise preferred embodiments.

According to the invention, a system for detecting an input and controlling at least one downstream device is provided, wherein the system comprises at least one sensor device and an evaluation and control device connected to the sensor device for signalling purposes, wherein the at least one sensor device detects an input signal which varies at least over time in the form of a movement, wherein the evaluation and control device evaluates at least the time profile of the detected input signal, wherein at least one evaluation condition is specified, and wherein the downstream device is activated when the at least one evaluation condition is met.

The input signal is a specific repeatable characteristic movement of a user. Advantageously, the user carries out this movement with a hand or with a finger. Such a specific movement could be, for example, a tapping movement or a similar characteristic repeatable movement. Of course, the invention is not limited to a single type of movement. Such a system therefore makes it possible to detect an input signal, the information content of which includes the movement of the user. Such a movement is always time-dependent. Accordingly, a movement by the user can be identified and evaluated as an input by a user by means of a corresponding evaluation of the time profile of the input signal in connection with the evaluation of at least one predetermined evaluation condition. A characteristic form of the detected input signal is analysed and interpreted by specifying the at least one evaluation condition. A movement of a user is thus detected by the at least one sensor device and an evaluation or analysis of this movement is carried out and interpreted accordingly. Predetermined movements can thus be interpreted as an intentional input.

The present invention thus differs from known touch sensors and proximity sensors which can detect a static input signal in the form of a touch. The use of such a static input signal is disadvantageous because it is very error-prone. A specific value must be selected, above which a signal from the sensor device is evaluated as an input signal. If this value is too low, any influences on the sensor device can also be evaluated as an input signal. For example, a dog walking past a dishwasher can cause the door to open. Furthermore, if the value is too high, intentional inputs may not be recognised as such.

The system according to the invention can be integrated in a household appliance, for example. However, the invention is not limited to such an embodiment, since this could be integrated into any devices, appliances, etc., which require a corresponding operation by a user. Any applications that include opening a door or activating a function would therefore be conceivable. A piece of furniture with a heavy door could be equipped with such a system. It would also be conceivable that the system can be used to open the tailgate of a car.

Advantageously, several evaluation conditions are specified. These evaluation conditions can advantageously be used to identify different types of movement by the user. A first input signal which varies over time in the form of a movement of the user can thus preferably be detected by a first subset of evaluation conditions. A second input signal which varies over time in the form of a movement of the user can be detected by a further subset of evaluation conditions. For example, a single tapping movement can be recognised as a first input signal and a double tap as a second input signal. Advantageously, due to different types of movement, different functions of the at least one downstream device and/or different or multiple similar downstream devices can be controlled.

According to a preferred embodiment, the at least one sensor device comprises at least one sensor selected from: at least one capacitive sensor and/or at least one optical sensor, at least one airflow sensor, at least one temperature sensor, at least one ultrasonic distance sensor and/or at least one electromagnetic sensor such as lidar or radar. However, the invention is not limited to the sensors mentioned. Other types of sensors would also be conceivable, by which an analogue detection of an input signal in the form of a movement can take place. An active spatial region is advantageously defined, in which a detection takes place by the at least one sensor device. Movements, actions and conditions outside the active region are therefore not detected by the system as possible input signals. Such an active region can be provided on or in front of a sensor of the at least one sensor device. The active region can comprise a contact surface on and/or in front of which the user can perform a corresponding movement. However, active regions without a contact surface would also be conceivable. This would allow contactless input. In accordance with one aspect of the invention, such a contact surface does not mean a surface on an electrode of a touch sensor. Rather, such a contact surface could be arranged on a spacer material. Such a spacer material could be a door, a panel or the like. The sensor device or the sensor or an electrode of the sensor are arranged in or behind the spacer material. According to a further aspect of the invention, the contact surface is a surface on an electrode of a sensor. According to a further aspect, no spacer material is arranged in front of the sensor. Sensors such as optical sensors or other electromagnetic sensors must be arranged directly in or on a corresponding outer surface so that the profile of the electromagnetic waves is restricted as little as possible. The active region can advantageously comprise a reference surface, which can also be imaginary. The input movements of the user or the input signal are then advantageously detected relative to the reference surface. Defining a specific active region reduces the susceptibility of the system to errors. Movements, actions and conditions outside the active region are therefore not detected by the system as possible input signals. The sensor device preferably has a plurality of sensors which are arranged next to one another in a type of matrix. A sensor would thus advantageously correspond to a detection pixel.

According to a further advantageous embodiment, a sensor data function is formed from the detected input signal. Raw data from the at least one sensor device are preferably read out at a predetermined readout rate and stored in a storage device. The readout rate is preferably in a range between 1 Hz and 1 GHz, preferably 20 Hz and 200 Hz, preferably in a range between 25 Hz and 100 Hz, more preferably in a range between 40 Hz and 60 Hz, more preferably at 50 Hz (T=20 ms). The storage device is advantageously a digital ring memory. However, other types of storage devices are also conceivable. In one aspect of the invention, a smoothing/filtering method is applied to the raw data, creating the sensor data function. The smoothing/filtering method is preferably selected from: a method for determining the moving average, frequency filtering by means of Fourier analysis, use of a high-pass or low-pass filter, use of a Butterworth filter, use of a Chebychev filter, method for exponential smoothing, use of a Kalman filter, use of a Gaussian filter, use of a kernel smoother, use of a Kolmogorov-Zurbenko filter, use of a Laplace filter, use of a local regression, use of a Ramer-Douglas-Peuker algorithm, use of a Savatzky-Golay filter, use of a stretched grid method, a data restriction to a specific absolute range or variance range, general fitting of data. Of course, other suitable smoothing/filtering methods can also be considered. In a method for determining the moving average, the smoothing is carried out by averaging adjacent data points. A sensor data function is thus created which consists of the average values of equally large subsets of the original data point set. A sufficiently high sampling rate and the implementation of smoothing/filtering methods thus provide a sensor data function which is of sufficient quality to ensure problem-free further evaluation by the evaluation and control device.

According to one aspect of the invention, the sensor data function is a time-dependent function. Advantageously, the time profile of the input signal is evaluated by differentiating the sensor data function according to time. The evaluation and control device is advantageously set up and intended to carry out a corresponding differential calculation. At least one first derivative function and/or at least one higher derivative function, for example a second derivative function, is preferably formed. Accordingly, at least one function is advantageously formed which corresponds to the first derivative of the sensor data function over time or is proportional to the first derivative and/or a function which corresponds to the second derivative or a higher derivative of the sensor data function over time or is proportional to the second or higher derivative. The at least one evaluation condition is preferably predetermined with regard to the first derivative function and/or the higher, for example second, derivative function.

According to a further advantageous embodiment, at least three evaluation conditions are specified. A first evaluation condition is advantageously that the first or second derivative function exceeds a first threshold value specified for the corresponding function. The exceeding of this first threshold value by the first or second derivative function preferably establishes a first time value. A second evaluation condition is preferably that the first or second derivative function undershoots a second threshold value specified for the corresponding function. In this case, it is preferred that the undershooting of the second threshold value by the first or second derivative function establishes a second time value. A third evaluation condition is advantageously met if the difference between the second time value and the first time value is below a predetermined threshold value.

An advantageous characteristic type of movement can correspond to a substantially Gaussian sensor data function. The first and second threshold values are used to determine a corresponding rise or a phasing out of the substantially Gaussian sensor data function from or into the zero line. In the case of an evaluation of the first derivative function, the first and the second threshold value thus define a specific slope above which an input signal is evaluated. In the case of an evaluation of the second derivative function, the first and the second threshold value thus define a specific curvature above which an input signal is evaluated. The first derivative function or the second derivative function can be used. However, it would also be conceivable for the first and the second derivative function to be used. Of course, corresponding first and second threshold values are then defined for the first and the second derivative function.

The third threshold value thus determines the time interval between the rise and the phasing out of the sensor data function. By the setting of this distance, only typical input signals are recognised, thereby minimising the probability of errors.

At least three evaluation conditions are specified. A first evaluation condition is preferably that the sensor data function exceeds a first threshold value. The exceeding of the sensor data function above the first threshold value preferably defines a first time value. A second evaluation condition is advantageously that the sensor data function undershoots a second threshold value. The undershooting of the sensor data function below the second threshold value preferably defines a second time value. A third evaluation condition is advantageously met if the difference between the second time value and the first time value is below a predetermined threshold value. This evaluation option is analogous to the evaluation described, including the first and/or second derivative function.

It would also be conceivable for the described evaluation of the sensor data function to take place in combination with an evaluation of the first and/or the second derivative function. Combinations of this type can result in further error minimisation.

According to a further advantageous embodiment, a parameterised reference signal is stored in a storage device. At least one evaluation condition is advantageously specified, which includes a correlation of the sensor data function with the parameters of the reference signal. The evaluation thus includes a comparison of the sensor data function with a reference function or a reference signal. Such a comparison can be, for example, a comparison of at least one value of the sensor data function with a parameter range of the reference function at a specific point in time of the signal profile.

According to a further advantageous embodiment, a first evaluation condition is that the sensor data function reaches or exceeds a predetermined maximum value. Preferably, a second evaluation condition is undershooting a second threshold value within a predetermined time interval. Accordingly, the second evaluation condition is a drop in the sensor data function from a maximum value to the zero line within a predetermined time interval.

According to a further advantageous embodiment, at least one third derivative function is formed. Accordingly, at least one function is advantageously formed which corresponds to the third derivation of the sensor data function over time or is proportional to the third derivative. An evaluation condition advantageously includes a change in the acceleration of the input signal in the form of a movement. The jerk or the change in the speed of the movement is thus defined as an evaluation condition.

Furthermore, it is conceivable that further evaluation conditions are specified in each of the evaluations described. It would also be conceivable for the evaluations described to be combined in a suitable manner.

According to a further advantageous embodiment, the at least one sensor device detects a spatially changing input signal in the form of a movement. The evaluation and control device advantageously evaluates the spatial profile of the detected input signal. At least one evaluation condition with regard to the spatial profile is preferably specified. Accordingly, in addition to the time profile of the input signal, the spatial profile of the input signal can also be evaluated. Accordingly, it is advantageous that the at least one sensor device is designed in such a way that it detects an input signal in the form of a movement in a spatially resolved manner. An input movement of this type can be a swiping movement, for example.

The at least one evaluation condition can comprise, for example, certain localised points or ranges in the active region. If these ranges are exceeded, a direction of the movement can then be inferred. In the case of an evaluation that includes the time profile and spatial profile, a speed of the movement of the user can also be determined, for example. The at least one evaluation condition can then include a specific speed range, for example. A slow movement could trigger a first function or activate a device and a fast movement could trigger a second function or activate a device.

According to a further advantageous embodiment, a sensor data function assigned to the input signal which varies over time in the form of a repeatable characteristic movement can be stored in a storage device. Furthermore, a specific activation of the downstream device can be assigned to the stored sensor data function. Such a system can thus learn specific characteristic movements. The user can start a process in which a characteristic movement can be input.

Advantageously, the system automatically selects suitable evaluation conditions or a suitable evaluation process. The user can also select a specific downstream device or a specific function of a downstream device which is to be controlled in the future using the sensor data function or the input signal in the form of a characteristic movement. The user is thus provided with extensive ease of operation.

The present object is also achieved by a method for detecting an input and controlling at least one downstream device. The method can be equipped with all the features already described above in the context of the system individually or in combination with one another, and vice versa.

The method for detecting an input and controlling at least one downstream device comprises the following method steps:
  a) detecting an input signal which varies at least over time and/or spatially in the form of a movement by at least one sensor device;
  b) evaluating the time profile and/or spatial profile of the detected input signal by an evaluation and control device, wherein at least one evaluation condition is specified;
  c) activating the downstream device when the at least one evaluation condition is met.

The present object is also achieved by a household appliance having a system for detecting an input and controlling a downstream device. The household appliance can be equipped in this case with all the features already described above in the context of the system individually or in combination with one another, and vice versa.

In one aspect of the invention, the household appliance is a dishwasher. Advantageously, at least one downstream device is a door opening device. The household appliance, for example a dishwasher, could therefore be fully integrated into a kitchen arrangement. In particular, no door handle is required to open the household appliance.

The present object is also achieved by a piece of furniture having a system for detecting an input and controlling a downstream device. The piece of furniture can be equipped in this case with all the features already described above in the context of the system or the method individually or in combination with one another, and vice versa. The piece of furniture advantageously has a door and a downstream device in the form of a door opening device for opening the door.

The present object is also achieved by a motor vehicle having a system for detecting an input and controlling a downstream device. The motor vehicle can be equipped in this case with all the features already described above in the context of the system or the method individually or in combination with one another, and vice versa. The motor vehicle advantageously has a door or a tailgate and a downstream device in the form of a door opening device for opening the door or a tailgate opening device for opening the tailgate.

Further advantages, aims and properties of the present invention will be explained with reference to the following description of the accompanying drawings. Similar components may have the same reference signs in the various embodiments.

DETAILED DESCRIPTION

Figure 1:
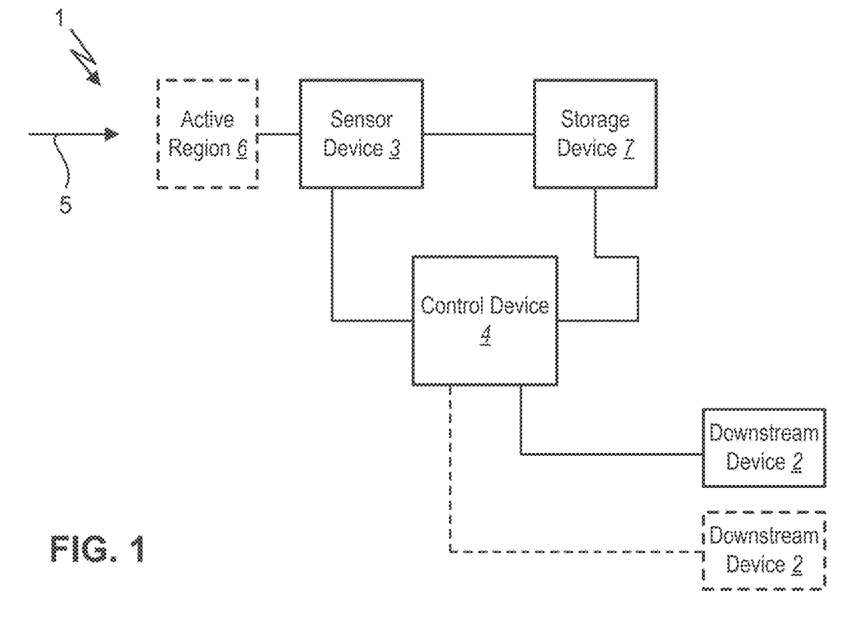
FIG. 1 shows a system for detecting an input and controlling at least one downstream device.

FIG. 1 shows a system 1 for detecting an input and controlling at least one downstream device 2, wherein the system 1 comprises at least one sensor device 3 and an evaluation and control device 4 connected to the sensor device 3 for signalling purposes, wherein the at least one sensor device 3 detects an input signal 5 which varies at least over time in the form of a movement, wherein the evaluation and control device 4 evaluates at least the time profile of the detected input signal 5, wherein at least one evaluation condition is specified, and wherein the downstream device is activated when the at least one evaluation condition is met.

The system can be operated with a method for detecting an input and controlling at least one downstream device 2. The method comprises the following method steps:
  a) detecting an input signal 5 which varies at least over time and/or spatially in the form of a movement by at least one sensor device 3;
  b) evaluating the time profile and/or spatial profile of the detected input signal 5 by an evaluation and control device 4, wherein at least one evaluation condition is specified;
  c) activating the downstream device 2 when the at least one evaluation condition is met.

The at least one sensor device 3 comprises at least one capacitive sensor and/or at least one optical sensor. Alternatively or cumulatively, the at least one sensor device can comprise at least one airflow sensor, at least one temperature sensor, at least one ultrasonic distance sensor and/or at least one electromagnetic sensor such as lidar or radar. Of course, other types of sensors would also be conceivable. However, the sensor device preferably does not include a vibration sensor which detects, for example, acoustic longitudinal waves guided through a machine body.

The at least one sensor device defines an active region 6 in which detection takes place. The active region can be two-dimensional or three-dimensional. The sensor device 3 can be designed in such a way that it can detect the input signal in a time-resolved and/or spatially-resolved manner. With regard to spatial resolution, the active region determines the limits of local detection. Such an active region 6 can be provided on or in front of a sensor of the at least one sensor device 3. The active region 6 can comprise a contact surface on and/or in front of which the user can perform a corresponding movement. However, active regions without a contact surface would also be conceivable. This would allow contactless input. However, according to one aspect of the invention, such a contact surface is not intended to mean a surface on an electrode of a touch sensor. Rather, such a contact surface could be arranged on a spacer material. Such a spacer material could be a door, a panel or the like. According to a further aspect of the invention, the contact surface can be a surface of an electrode of a sensor. The sensor device 3 or the sensor or an electrode of the sensor are arranged in or behind the spacer material. The active region 3 can advantageously comprise a reference surface, which can also be imaginary. The input movements of the user or the input signal are then advantageously detected relative to the reference surface. Defining a specific active region 3 reduces the susceptibility to errors of the system 1. Movements, actions and conditions outside the active region 3 are therefore not detected by the system as possible input signals.

A capacitive sensor is a sensor that works on the basis of the change in the electrical capacitance of an individual capacitor or a capacitor system. The capacitance can be influenced by the value to be detected in various ways. For example, one electrode can be moved relative to another by a pushing movement. However, a capacitive sensor can also be designed as a type of proximity switch, the function of which is based on the change in the electrical field in the environment in front of its sensor electrode (active zone). An optical sensor can include, for example, a light source which emits visible or also infrared light, and a detector. A change in the reflection or the amount of light is detected by, for example, an input movement by a user.

The evaluation and control device 4 can comprise a digital computing unit, for example a proximity chip, which is connected to the sensor device for signalling purposes and evaluates the transmitted signals accordingly. It would also be conceivable for the evaluation and control device to comprise a resonant circuit which has a resonant frequency according to $f_0 = 1/[2\pi\sqrt{(LC)}]$. When a capacitive sensor is used, a change in the capacitance of the sensor can cause a change in the resonant frequency. Of course, the evaluation and control device can also include further components, for example components for controlling the downstream device 2 or components for carrying out the smoothing or filtering method. The evaluation conditions can be stored in a storage device which is connected to the evaluation and control device 4 for signalling purposes.

The input signal 5 is a specific characteristic movement of a user, for example a tapping movement or a single or multiple tap. Such a characteristic movement comprises movement relative to a reference surface in the active region, followed by deceleration or impact on a contact surface or electrode of the sensor. It would also be conceivable for the input signal 5 to be a swiping movement. For this purpose, it is advantageous that the at least one sensor device 3 detects a spatially changing input signal 5. The evaluation and control device 4 evaluates the spatial and/or time profile of the detected input signal 5. At least one evaluation condition is specified with regard to the spatial and/or time profile.

A plurality of evaluation conditions can also be specified. The evaluation conditions serve to identify a movement by the user as an intentional input signal 5. Different types of movement of the user can thus be detected and differentiated from one another. This has the advantage that different input signals 5 can be identified based on different types of movement and different functions of the at least one downstream device 2 and/or different or multiple similar downstream devices 2 can therefore be activated. In FIG. 1, further identical or different downstream devices are shown as an option by broken lines.

Figure 3:
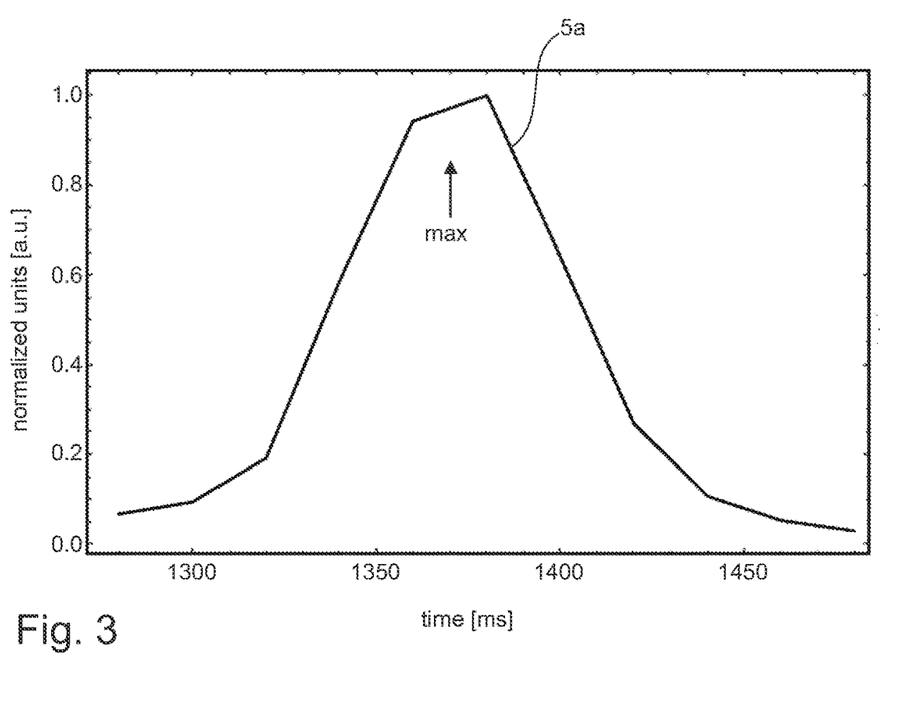
FIG. 3 is a diagram of the time profile of a sensor data function.

FIG. 3 shows a sensor data function 5a which is formed from the detected input signal 5. The raw data of the at least one sensor device 3 are read out at a predetermined readout rate and are stored in a storage device 7. Such a storage device 7 can be a digital ring memory or a storage device designed in some other way. To improve the signal quality, a smoothing method is used in the form of a method for determining the moving average. Of course, further smoothing and/or filtering methods which remove noise and interference from the raw data would also be conceivable. After use of this method/these methods, the sensor data function 5a is obtained, which is then evaluated by means of the evaluation and control device 4.

By specifying the evaluation condition, a characteristic form of the detected input signal 5 is analysed and interpreted. The input signal 5 can be interpreted as a movement of the user by the at least one, advantageously by a plurality of evaluation conditions. As can be seen in FIG. 3, the sensor data function 5a has a characteristic form having a substantially Gaussian profile. In the case of a characteristic movement, for example a tapping movement, the signal increases as a result of a reduction in the distance between a hand or a finger of the user and a reference surface, for example an electrode of the sensor. Depending on the sensor used, the reduced distance can also take place with respect to another reference surface. Such a reference surface can also be an imaginary surface within the active region. The hand or finger then hits the reference surface or is slowed down by the user. In this state, the input signal or the sensor data function has a maximum. This is marked in FIG. 3 with the expression "max." The hand or finger is then moved away from the reference surface again and the sensor data function decreases again. Of course, this invention is not limited to the detection of characteristic movements in the form of tapping movements. An evaluation of otherwise repeatable characteristic movements would also be conceivable.

Figure 4:
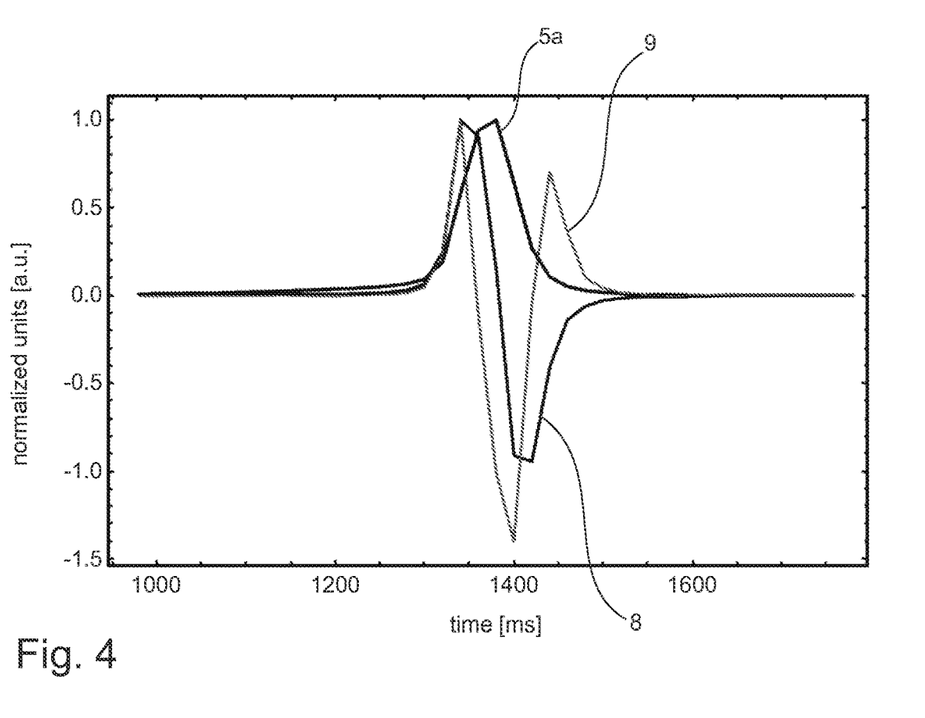
FIG. 4 is a diagram of the time profile of a sensor data function, the first derivative function and the second derivative function.

Other types of movements, which are to be interpreted as an input signal 5, can of course also have a different characteristic profile. The sensor data function 5a per se or also a first derivative function 8 or a second derivative function 9 can be used to analyse the characteristic shape. The first derivative function 8 is a function of the first derivative ($\partial/\partial t$) of the sensor data function 5a over time. The second derivative function 9 is a function of the second derivative ($\partial^2/\partial t^2$) of the sensor data function 5a over time. The smoothing method already mentioned ensures that the sensor data function 5a can be differentiated. Accordingly, the time profile of the input signal 5 can be evaluated by differentiating the sensor data function 5a according to time, wherein at least one first derivative function 8 and/or at least one second derivative function 9 are formed. FIG. 4 is a diagram which shows the sensor data function 5a as well as the first derivative function 8 and the second derivative function 9. A combination of the evaluation options mentioned would also be conceivable. Of course, at least one evaluation condition, preferably a plurality of evaluation conditions, is specified for each evaluation option.

Figure 5:
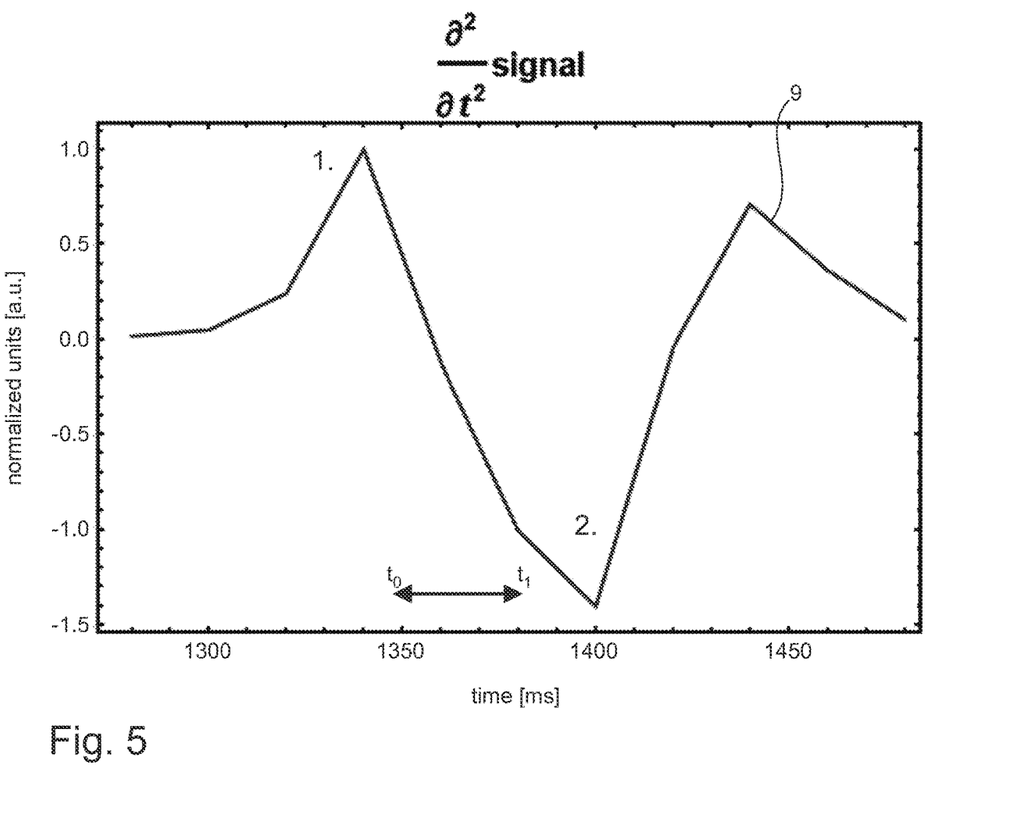
FIG. 5 is a diagram of the time profile of the second derivative function.

The evaluation is based on at least three evaluation conditions. A first evaluation condition is that the first derivative function 8 and/or the second derivative function 9 and/or the sensor data function 5a exceed a first threshold value specified for the corresponding function. In the case of the second derivative function 8, this is marked in FIG. 5 with "1." Exceeding the first threshold means a rise in the sensor data function 5a. A first time value to is defined by the first derivative function 8 and/or the second derivative function 9 and/or the sensor data function 5a exceeding the respective first threshold value. The analysis of the sensor data function 5a thus begins. The second evaluation condition is that the first derivative function 8 and/or the second derivative function 9 and/or the sensor data function 5a undershoots a respective second threshold value. In the case of the second derivative function 8, this is marked in FIG. 5 with "2." When the first derivative function 8 and/or the second derivative function 9 and/or the sensor data function 5a undershoots the respective second threshold value, a second time value $t_1$ is defined. When the respective second threshold value is not reached, a transition of the sensor data function 5a to a zero line or a decay or drop of the sensor data function 5a is detected. Obviously, when comparing the corresponding derivative functions, a value proportional to the corresponding derivative is always considered. Finally, a third evaluation condition is checked, according to which the difference between the second time value $t_1$ and the first time value to should be below a predetermined threshold value $(t_1-t_0<t_{Schwellwert})$. The third evaluation condition checks realistic durations of a tapping movement. An event which includes a random increase and a random decrease in the sensor data signal after a longer period of time is thus not identified as an input signal 5.

Alternatively or cumulatively, further evaluation options can also be considered. A parameterised reference signal can be stored in a memory device and at least one evaluation condition can be specified, which includes a correlation of the sensor data function with the parameters of the reference signal. It would also be conceivable that a first evaluation condition is that the sensor data function reaches or exceeds a predetermined maximum value and a second evaluation condition is that the value undershoots a second threshold value within a predetermined time interval. Furthermore, it would be possible for at least a third derivative function to be formed and for an evaluation condition to be a change in the acceleration of the input signal in the form of a movement.

According to a further advantageous embodiment, a sensor data function 5a assigned to the input signal 5 which varies over time in the form of a repeatable characteristic movement can be stored in a storage device 7. Furthermore, a specific activation of the downstream device 2 can be assigned to the stored sensor data function 5a. Such a system 1 can thus learn certain characteristic movements. The user can start a process in which a characteristic movement can be input. The system can automatically select suitable evaluation conditions or a suitable evaluation process. The user can also select a specific downstream device 2 or a specific function of a downstream device 2 which is to be controlled in the future using the sensor data function 5a or the input signal 5 in the form of a characteristic movement.

Figure 2:
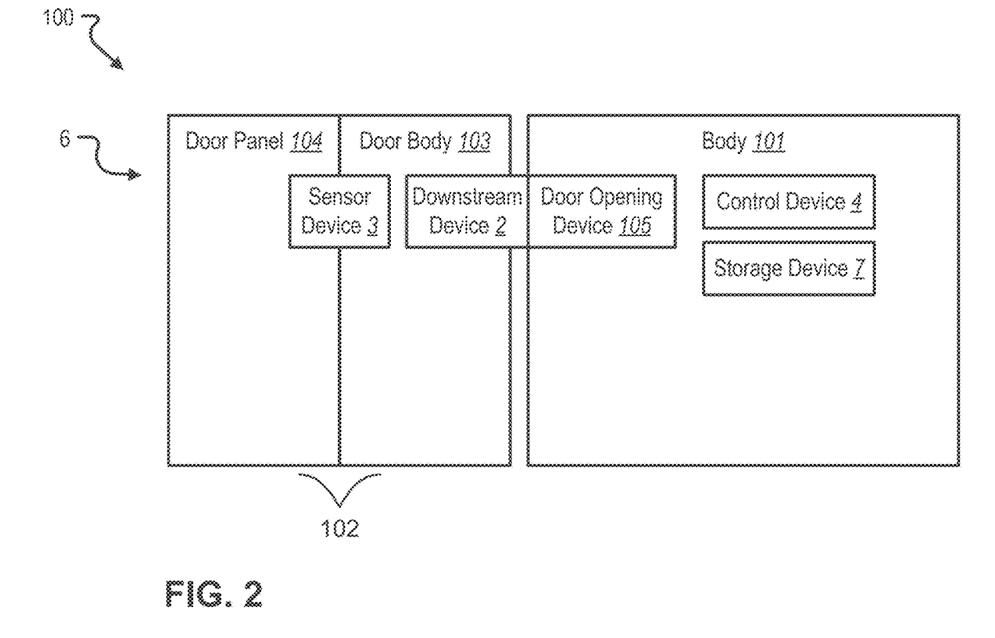
FIG. 2 shows a household appliance having a system for detecting an input and controlling at least one downstream device.

Such a system 1 for detecting an input and controlling a downstream device 2 can be integrated into a household appliance 100, for example. FIG. 2 shows such a household appliance 100 in the form of a dishwasher. The household appliance 100 has a body 101 in which, among other things, the evaluation and control device 4 and the storage device 7 can be provided. The household appliance 100 also comprises a door 102 which comprises a door body 103 and a door panel 104 attached to the door body 103. The sensor device 3 comprises a capacitive sensor, the electrode of which is arranged between the door body 103 and the door panel. In front of the electrode, the active region 6 is provided, in which an input signal can be detected. Of course, further electrodes or sensors can also be provided. The further electrodes could be arranged next to one another in a type of matrix. An electrode would thus advantageously correspond to a detection pixel. The entirety of the electrodes or the matrix of electrodes would then determine the extent of the entire active region 6. The electrode or the electrodes and the active region are preferably provided in an upper region of the household appliance 100, which is easily accessible for the user. In this case, the downstream device 2 is a door opening device 105. For example, a single tap on the door 102 in the active region can cause the one door opening device 105 to open. For example, a double tap could activate a child lock mode of the door opening device 105.

The applicant reserves the right to claim all the features disclosed in the application documents as substantial to the invention, provided that these are novel, individually or in combination, over the prior art. It is further pointed out that features which in themselves can be advantageous have also been described in the individual drawings. A person skilled in the art will immediately recognise that a particular feature described in one drawing can also be advantageous without adopting further features from said drawing. A person skilled in the art will also recognise that advantages can also result from a combination of a plurality of features shown in individual or in different drawings.

LIST OF REFERENCE SIGNS 1 system
2 downstream device
3 sensor device
4 evaluation and control device
5 input signal
5a sensor data function
6 active region
7 storage device
8 first derivative function
9 second derivative function
100 household appliance
101 body
102 door
103 door body
104 door panel
105 door opening device
$t_0$ first time value
$t_1$ second time value

What is claimed is:

1. A system for detecting an input and controlling at least one downstream device, comprising:
   at least one sensor device; and
   an evaluation and control device connected to the sensor device for signalling purposes, wherein the at least one sensor device detects an input signal in a form of a movement, wherein the input signal is a specific repeatable characteristic movement of a user, wherein the evaluation and control device evaluates at least one time profile of the detected input signal to determine if the input signal comprises an intentional input signal, wherein at least one evaluation condition is specified, and wherein the at least one downstream device is activated when the at least one evaluation condition is met.

2. The system according to claim 1, wherein a plurality of evaluation conditions are specified, wherein these evaluation conditions can be used to identify different types of movement by the user, and wherein due to different types of movement, different functions of the at least one downstream device and/or different downstream devices can be controlled.

3. The system according to claim 1, wherein the at least one sensor device comprises at least one sensor selected from:
   at least one capacitive sensor, at least one optical sensor, at least one airflow sensor, at least one temperature sensor, at least one ultrasonic distance sensor and/or at least one electromagnetic sensor such as lidar or radar, wherein the at least one sensor device defines an active region in which a detection occurs.

4. The system according to claim 1, wherein a sensor data function is formed from the detected input signal, wherein raw data from the at least one sensor device are read out at a predetermined readout rate and stored in a storage device, wherein the storage device is a digital ring memory, wherein a smoothing/filtering method is applied to the raw data, creating the sensor data function, and wherein the smoothing/filtering method is selected from:
   a method for determining the moving average, frequency filtering by means of Fourier analysis, use of a high-pass or low-pass filter, use of a Butterworth filter, use of a Chebychev filter, method for exponential smoothing, use of a Kalman filter, use of a Gaussian filter, use of a kernel smoother, use of a Kolmogorov-Zurbenko filter, use of a Laplace filter, use of a local regression, use of a Ramer-Douglas-Peuker algorithm, use of a Savatzky-Golay filter, use of a stretched grid method, a data restriction to a specific absolute range or variance range, and general fitting of data.

5. The system according to claim 4, wherein the at least one time profile of the input signal is evaluated by differentiating the sensor data function according to time, wherein at least one first derivative function and/or at least one higher derivative function are formed, and wherein the at least one evaluation condition relates to the at least one first derivative function and/or the at least one higher derivative function is specified.

6. The system according to claim 5, wherein a first evaluation condition is that the at least one first derivative function and/or the at least one higher derivative function exceeds a first threshold value, wherein the exceeding of the first threshold value by the at least one first derivative function and/or the at least higher derivative function establishes a first time value, wherein a second evaluation condition is that the at least one first derivative function and/or the at least one higher derivative function undershoots a second threshold value, wherein the undershooting of the second threshold value by the at least one first derivative function and/or the at least one higher derivative function establishes a second time value, and wherein a third evaluation condition is met if the difference between the second time value and the first time value is below a predetermined threshold value.

7. The system according to claim 4, wherein a first evaluation condition is that the sensor data function exceeds a first threshold value, wherein the exceeding of the first threshold value by the sensor data function establishes a first time value, wherein a second evaluation condition is that the sensor data function undershoots a second threshold value, wherein the undershooting of the second threshold value by the sensor data function establishes a second time value, and wherein a third evaluation condition is met if the difference between the second time value and the first time value is below a predetermined threshold.

8. The system according to claim 4, wherein a parameterised reference signal is stored in the storage device, and wherein the at least one evaluation condition comprises a correlation of the sensor data function with parameters of the parameterised reference signal.

9. The system according to claim 4, wherein a first evaluation condition is that the sensor data function reaches or exceeds a predetermined maximum value, and wherein a second evaluation condition is that the sensor data function undershoots a second threshold value within a predetermined time interval.

10. The system according to claim 1, wherein at least a third derivative function is formed, and wherein an evaluation condition comprises a change in the acceleration of the input signal in the form of a movement.

11. The system according to claim 1, wherein the at least one sensor device detects a spatially changing input signal in the form of a movement, wherein the evaluation and control device evaluates a spatial profile of the detected input signal, and wherein the at least one evaluation condition relates to the spatial profile.

12. The system according to claim 1, wherein a sensor data function assigned to the input signal which varies over time in the form of a movement can be stored in a storage device, and wherein a specific activation of the downstream device can be assigned to the stored sensor data function.

13. A household appliance having the system for controlling a downstream device according to claim 1.

14. The household appliance according to claim 13, wherein the downstream device is a door opening device.

15. A method for detecting an input and controlling at least one downstream device, comprising:

a) detecting an input signal which varies at least over time and/or spatially in the form of a movement by at least one sensor device, wherein the input signal is a specific repeatable characteristic movement of a user;

b) evaluating a time profile and/or spatial profile of the detected input signal by an evaluation and control device to determine if the input signal comprises an intentional input signal; and c) controlling the at least one downstream device, wherein at least one evaluation condition is specified, and wherein the at least one downstream device is activated when the at least one evaluation condition is met.

16. A system for detecting an input and controlling at least one downstream device according to claim 15.

* * * * *